United States Patent [19]

Hanzic

[11] Patent Number: 5,288,974
[45] Date of Patent: Feb. 22, 1994

[54] CONTROL ARRANGEMENT FOR A SEAT HEATER

[75] Inventor: Dirk Hanzic, Töcksfors, Sweden

[73] Assignee: Plantron AB, Töcksfors, Sweden

[21] Appl. No.: 634,879

[22] PCT Filed: Mar. 12, 1990

[86] PCT No.: PCT/SE90/00160
§ 371 Date: Jan. 9, 1991
§ 102(e) Date: Jan. 9, 1991

[87] PCT Pub. No.: WO90/10999
PCT Pub. Date: Sep. 20, 1990

[30] Foreign Application Priority Data

Mar. 14, 1989 [GB] United Kingdom ............ 8905829.1

[51] Int. Cl.⁵ ..................... H05B 1/02; H05B 3/34
[52] U.S. Cl. ................... 219/501; 219/202; 219/497; 219/528
[58] Field of Search ........... 219/202, 203, 501, 505, 219/497, 494, 504, 212, 491, 528

[56] References Cited

U.S. PATENT DOCUMENTS

| | | | |
|---|---|---|---|
| 2,698,893 | 1/1955 | Ballard | 219/203 |
| 3,423,574 | 1/1969 | Shomphe et al. | 219/216 |
| 3,586,829 | 6/1971 | Farmer et al. | 219/501 |
| 4,464,564 | 8/1984 | Zimmermann et al. | 219/504 |
| 4,633,061 | 12/1986 | Arikawa | 219/202 |
| 4,736,091 | 4/1988 | Moe | 219/505 |

FOREIGN PATENT DOCUMENTS 3336864 11/1987 Fed. Rep. of Germany.
457046 11/1988 Sweden.

*Primary Examiner*—Mark H. Paschall
*Attorney, Agent, or Firm*—Spencer, Frank & Schneider

[57] ABSTRACT

A heating arrangement for heating a seat has a temperature responsive element and a control circuit for controlling the supply of electrical current to the heating element which is embedded in the seat. The control circuits formed of components mounted on a flexible printed circuit board.

13 Claims, 4 Drawing Sheets

CONTROL ARRANGEMENT FOR A SEAT HEATER

BACKGROUND OF THE INVENTION

1. Field of the Invention

The present invention relates to a heating arrangement and more particularly relates to a heating arrangement suitable for use in heating the seat in a motor vehicle.

2. Description of the Related Art

It has been proposed previously to provide a heater integrated into the seat of a motor vehicle in order to heat the seat. Of course, it is necessary to provide some type of thermostatic control for such a heater.

It has been proposed to utilise an electromechanical relay, to effect such thermostatic control. However, such a relay, because it operates in a mechanical manner, cannot make a very large number of different "makes" and "breaks". Consequently such a relay must be adapted to operate with a relatively large hysteresis loop, for example, making at 15° C. and breaking at 35° C. Whilst such a relay may comprise a switch operated by relay coils in response to signals from a temperature sensing arrangement, another example of this type of arrangement is a bi-metallic thermostat switch, in which both the temperature sensor function and the switching function are embodied in the same device. Such a device does not need a control circuit, and is therefore very cheap. However, the big hysteresis loop that is necessary proves to be a disadvantage.

Other types of temperature sensors have been proposed for use in such an application, for example a thermistor, which is a resistor having a negative temperature dependence, or the base-emitter voltage of a transistor. However, if temperature sensors of this type are utilised a control circuit is needed to actuate the relay. This requires a control box or circuit which is located outside the seat squab, while the sensor is placed in the seat squab.

It would, of course, be possible to utilise a heating wire which has a positive, but very small, temperature dependence as the temperature sensor. In such an arrangement the resistance of the heating wire is monitored to provide the necessary control. However, this requires the provision of a complicated, and thus expensive, control circuit.

SUMMARY OF THE INVENTION

The present invention seeks to provide an improved heating arrangement.

According to one aspect of this invention there is provided a heating arrangement for heating a seat, said arrangement comprising electrical heating means embedded in the seat, and temperature responsive means and control means for controlling the supply of electrical current to the heating means, also embedded in the seat, wherein the temperature responsive means and the control means are comprised by components mounted on a flexible printed circuit board, embedded in the seat.

Conveniently, the temperature responsive means comprise means adapted to provide an output control signal whenever the temperature sensed by the temperature responsive means is below a pre-determined limit, and the control means comprise a power transistor.

Advantageously said transistor comprises a field effect transistor.

Conveniently the control means comprises a differential amplifier, means to provide a substantially constant pre-determined potential to a first terminal thereof, and means to provide a potential to a second terminal thereof, which include a temperature sensitive component so that the potential supplied to the second terminal of the differential amplifier depends upon the temperature sensed by the temperature sensitive component.

Preferably the first terminal of the differential amplifier is connected to a node between two resistors connected in series between an earth rail, and a rail carrying a substantially pre-determined potential, and the second terminal of the differential amplifier is connected to a node between a series connection of a resistor and a thermistor, connected in series between earth and said rail carrying said predetermined potential.

Advantageously the control arrangement is connected to enable the operation of the transistor and to disable the operation of the transistor.

Preferably an oscillator is employed to provide an oscillating signal, and a voltage doubler is provided, comprising the series connection of two diodes, the first diode being connected to a source of pre-determined potential, and the output of the oscillator being connected to the node between the two diodes, so that at the output of the second diode a signal is present comprising the sum of the pre-determined potential and the oscillating signal, the output at the second diode being connected to the control electrode of the transistor, but also being connected to the control means, the control means being adapted to provide a "low" signal to disable the transistor.

Conveniently the control means further comprises means to sense the potential provided to the heating arrangement from a battery and to provide a "low" signal to disable the transistor when the potential exceeds a pre-determined limit and when the potential is lower than another pre-determined limit.

Advantageously the said sensing means comprises two further differential amplifiers, one terminal of each differential amplifier being connected to a substantially constant source of potential, the other terminal of each differential amplifier being connected to a respective node in a respective resistive bridge extending between earth and a line carrying a signal proportional to the potential supplied by the battery, the arrangement being such that one of the differential amplifiers will provide a "low" signal to the control electrode of the power transistor in response to battery potential exceeding a pre-determined limit or falling below another pre-determined limit.

If a flexible printed circuit board is used, if it flexes frequently, signal paths can break, especially near the terminals of discrete components on the circuit board.

Preferably the flexible printed circuit board carries one or more discrete components, each component having at least two terminals connected to signal tracks present on the board, the signal tracks connected to the terminals of at least one component each splitting to form two signal track portions at a point spaced from the respective terminal, the two signal track portions approaching and contacting the terminal in directions which are perpendicular to each other. This may prevent the board being inoperative, even if some signal tracks break. It is often difficult to solder wires to a printed circuit board.

Preferably the printed circuit board comprises components mounted thereon and a plurality of signal tracks, the signal tracks having a pre-determined width, the printed circuit board carrying a plurality of bonding areas in contact with respective signal tracks, each bonding area having a width and a height equal to at least ten times the width of a signal track.

Conveniently said heating arrangement comprising heater means embedded in the seat, and thermostatic means responsive to the temperature in the seat to control the seat temperature to be at a pre-determined level, the arrangement including further thermostatic control means and means to activate the further thermostatic control means when the heating arrangement is initially activated, the further thermostatic control means being adapted to control the temperature of the seat at a higher temperature than the first thermostatic control means, the arrangement being such that when the heating arrangement is initially activated the seat is initially heated to a relatively high temperature as dictated by the second thermostatic control means, and subsequently cools to and is maintained at the lower temperature dictated by the first thermostatic control means.

Preferably said heating arrangement incorporates a heater wire to which electrical power is supplied, means being provided to monitor the voltage drop across the heater wire, and to disable the heating means if the voltage across the heater wire drops below a pre-set value.

Conveniently said arrangement incorporates means to sense the potential supplied to the heater arrangement, and means to disable the heater arrangement if the potential supplied thereto falls below a pre-determined limit.

BRIEF DESCRIPTION OF THE DRAWINGS

In order that the invention may be more readily understood, and so that further features thereof may be appreciated, the invention will now be described, by way of example, with reference to the accompanying drawings in which.

DETAILED DESCRIPTION OF THE PREFERRED EMBODIMENTS

Figure 1:
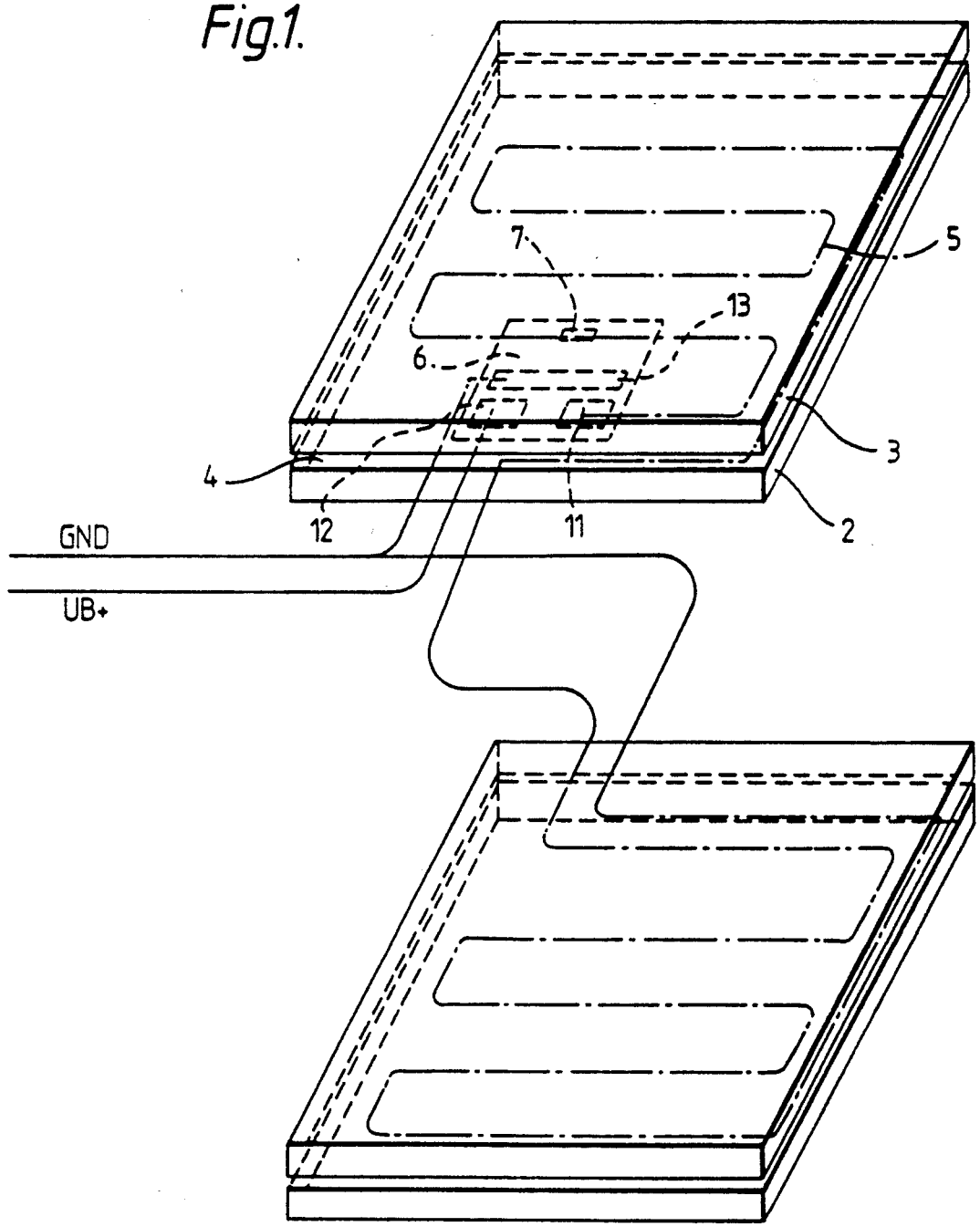
FIG. 1 is a diagrammatic view of a seat squab with a heater arrangement in accordance with the present invention, parts of the seat squab being shown as transparent to facilitate an understanding of the illustrated structure.
Figure 2:
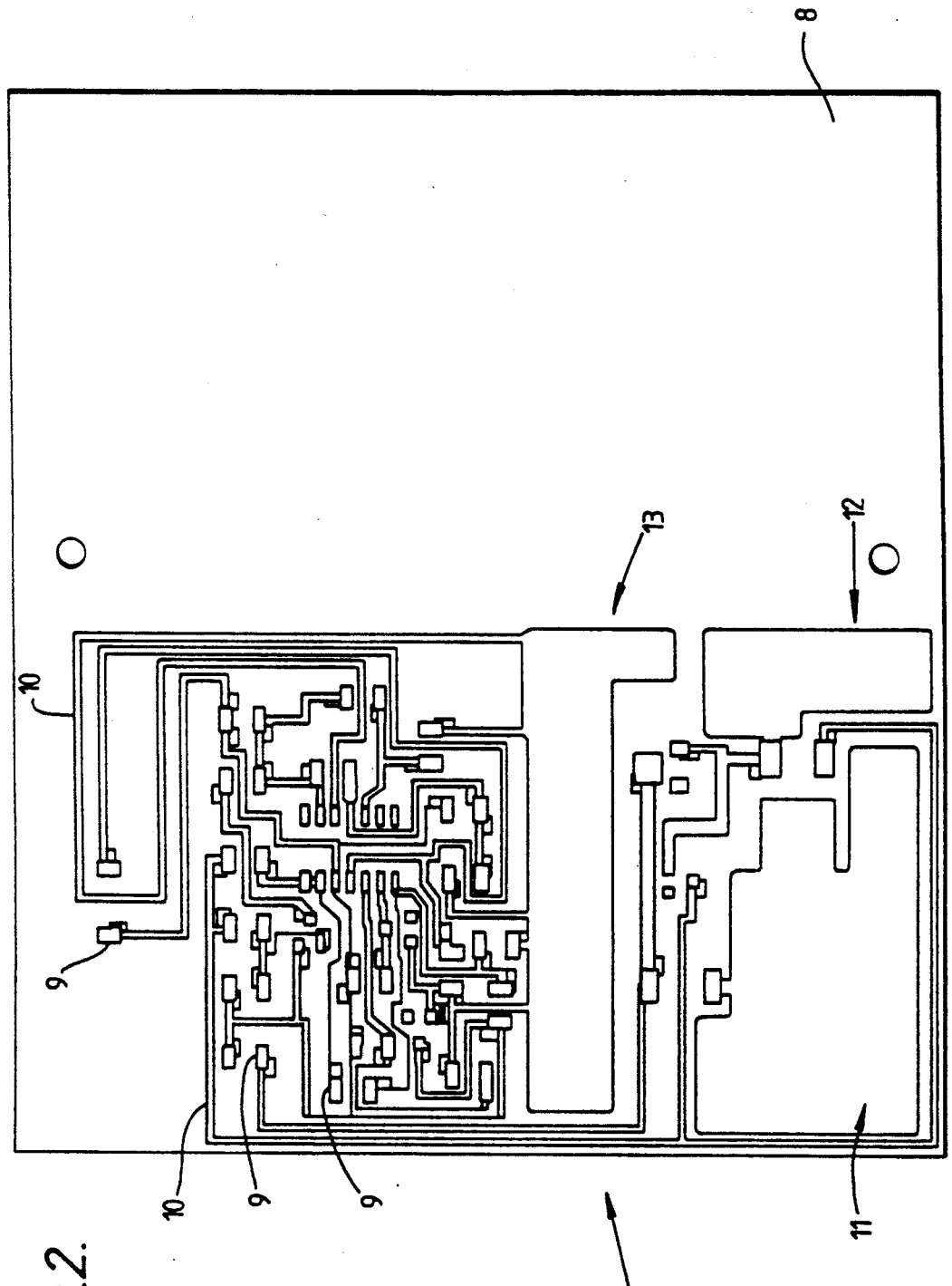
FIG. 2 is a plan view of a printed circuit board for use in a heating arrangement in accordance with the invention.

Referring initially to FIG. 1 of the accompanying drawing, a seat squab 1 for a motor vehicle seat is illustrated. The illustrated seat squab comprises two padding elements comprising a lower padding element 2 and an upper padding element 3. The padding elements are spaced apart slightly, in the drawing, to form a gap 4. Contained within the gap 4 is a heating wire 5 which is adapted to heat the seat. Also located in the gap 4 is a printed circuit 6, which is illustrated in more detail in FIG. 2. The printed circuit 6 comprises a temperature sensitive component 7 which is located directly above part of the wire.

It will be appreciated that, in production, the two padding elements 2, 3, will be permanently pressed and glued together to form, effectively, a single seat squab.

The printed circuit 6 is formed on a flexible printed circuit board 8. The printed circuit board 8 carries a number of discrete components 9 which, as illustrated, are connected by means of signal tracks, to three bonding areas 11, 12, 13. The bonding areas are relatively large, when compared with the size of the signal track. Typically each dimension of each bonding area is at least ten times the width of a signal track, but in some cases the dimensions of the bonding areas are up to 50 times greater than the width of a signal track.

The three bonding areas 11, 12, 13 are adapted to be connected to the heating wire and to a lead which extends from the squab of the seat to the wiring loom of the motor vehicle, but the size of the bonding pads 11, 12, 13 facilitates automated soldering from the lead to the printed circuit board 6, as illustrated.

Figure 3:
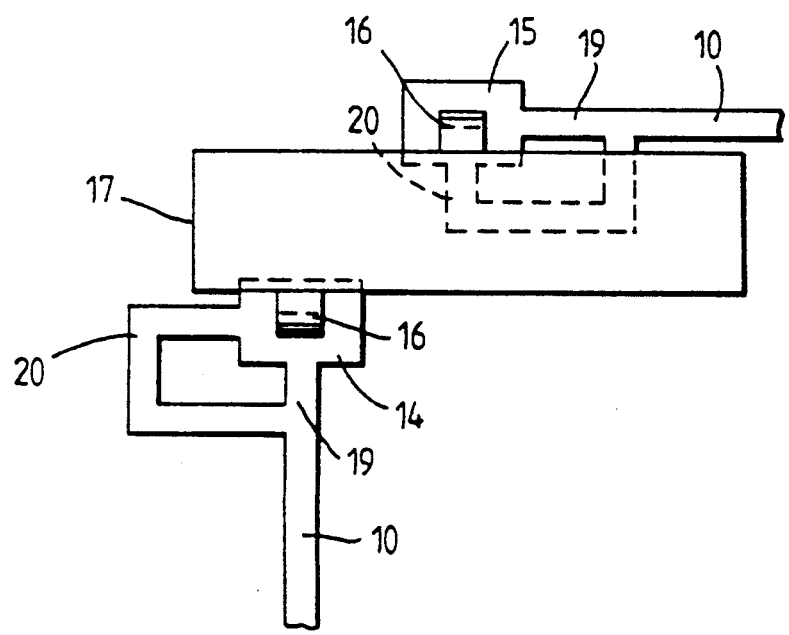
FIG. 3 is an enlarged view of part of the printed circuit board of FIG. 2.

FIG. 3 illustrates, at a much enlarged scale, part of the printed circuit 6. Two signal tracks 10 are illustrated, which extend to respective contact pads 14, 15 to which are connected terminals, 16, of a discrete component 17. The component 17 may have other terminals but only two are illustrated. It is to be observed that each signal track 10, as it approaches the appropriate contact pad 14 splits, at a point spaced from the contact pad 14 to form two separate signal track portions 19, 20. It is to be observed that the two signal track portions 19, 20 approach the respective contact pad in directions which are perpendicular to each other.

The printed circuit 8 is flexible, so that the presence of the printed circuit board is not felt by a person sitting on the squab of the seat as a hard portion within the seat, but so that the printed circuit board can flex and bend with the seat. If the printed circuit board flexes and bends, there is a risk that, in the region adjacent the contact legs of a discrete component, such as the component 17, the signal track may snap, due to metal fatigue. However, since each signal track approaches the contact pad 14 in two orthogonal directions, even if the signal track is subjected to repeated bending, only one part of the signal track will break, and it is thus envisaged that the described arrangement will prove to be long-lasting, even though the circuit is formed on a flexible printed circuit board which is subjected, in use, to repeated flexing operations.

Figure 4:
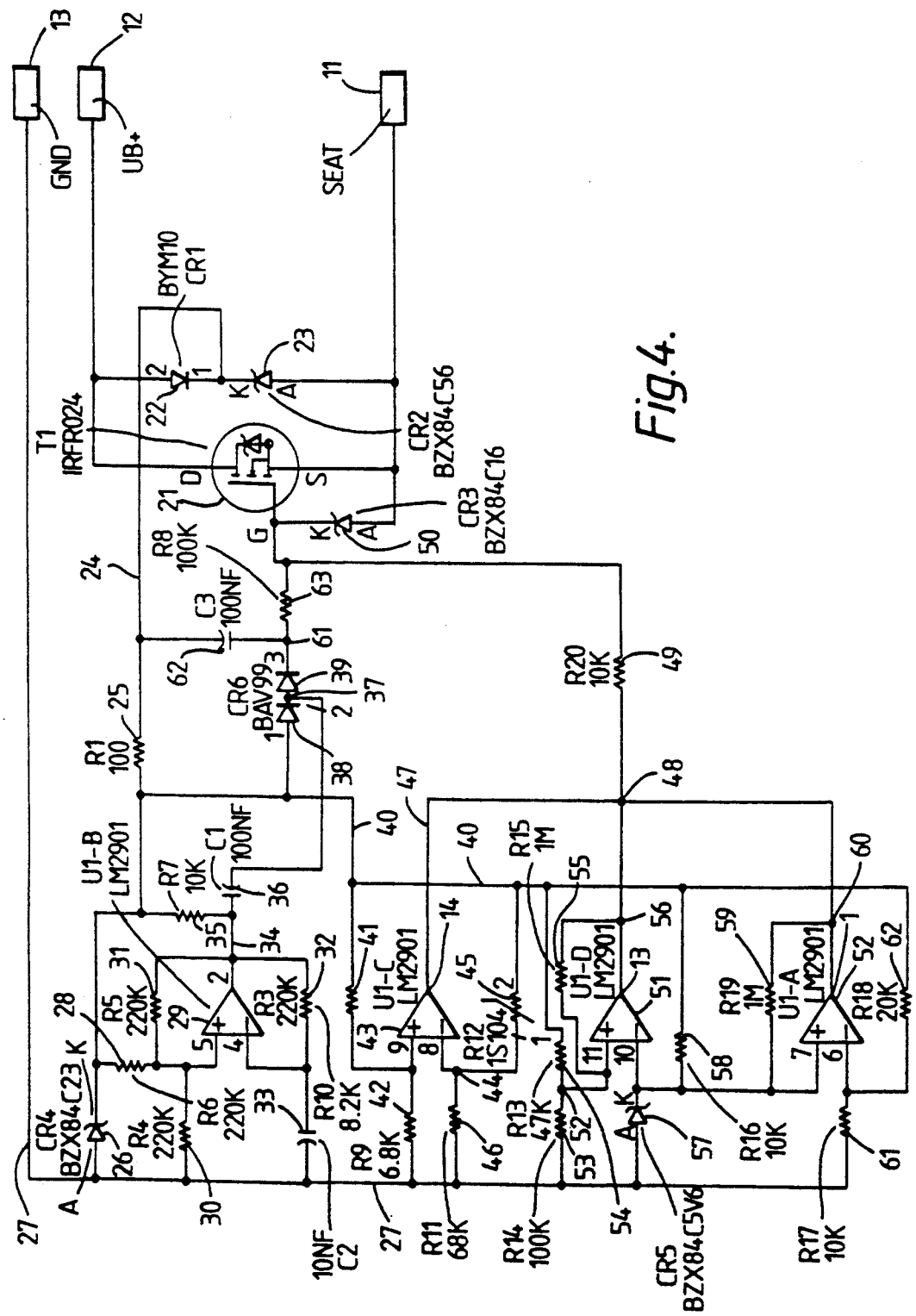
FIG. 4 is a circuit diagram of the circuitry present on the printed circuit board.

Referring now to FIG. 4, which is a circuit diagram of the circuitry present on the printed circuit board 6, it can be seen that, of the three contact pads, 11, 12, 13, the pad 11 is to be connected to the heating wire, the pad 12 is to be connected to the positive battery terminal present on the vehicle and the pad 13 is to be connected to ground.

A field effect power transistor 21 is provided which includes an integral zenerdiode, the source/drain current path through the field effect transistor being connected between the contact pad 12 and the contact pad 11.

It will be appreciated that when the field effect transistor is turned "on" current will be supplied from the pad 12 to the pad 11. The current may then flow through the heating wire 5, thus causing the seat to be heated.

A forward biassed diode 22 and a reverse biassed zenerdiode 23 are connected in series, the series connection of the two diodes extending in parallel with the controlled current flow path of the field effect transistor 21, in other words between the pad 12 and the pad 11. The diodes serve to protect the transistor against any transients, and the diode 22 serves to protect the control circuitry against reverse polarity, in case that the pad 12 is connected to a negative potential, whilst pad 13 is connected to ground, which can inadvertently happen.

A lead 24 extends from the node between the two diodes 22 and 23.

The lead 24 passes through a resistor 25 and a further zenerdiode 26 to an earth rail 27. The resistor 25 is a current limiting resistor, and the zenerdiode 26 serves to protect the control circuitry against transients.

The lead 24 is connected by means of a resistor 28 to one input terminal of a differential amplifier 29. The input terminal of the differential amplifier 29 is connected to the earth rail by means of a resistor 30 and is also connected to the output terminal of the differential amplifier by means of a further resistor 31. The output terminal of the differential amplifier is connected by means of a further resistor 32 to the other input terminal of the differential amplifier 29, and that other terminal is also connected by means of a capacitor 33 to the earth rail 27. The described arrangement operates as an oscillator, providing an output on the line 34. The line 34 is connected to the line 24 by means of a resistor 35, and the output 34 is connected by means of a capacitor 36 to a node 37 between two diodes 38, 39 which forms a voltage doubling circuit which will be described hereinafter.

A point on the line 24 between the resistor 25 and the zenerdiode 26 is connected, to a line 40. A point on the line 40 is connected to the series connection of two resistors 41, 42, which in turn are connected to the earth rail 27. The resistors 41 and 42 thus form a resistive bridge. The node between the two resistors is connected to one input of a second differential amplifier 43.

The other input of the second differential amplifier 43 is connected to a node point 44 formed between a resistor 45, which has a negative temperature coefficient, and which is connected to the line 40, and a further resistor 46 which is connected to the earth rail 27. The differential amplifier 43 thus serves to compare the voltage between the node points present on the two resistive bridges constituted by the resistor pairs 41, 42 and 45, 46.

The resistor 45 is a 1% NTC resistor. The output voltage of the differential amplifier 43 is high until the resistor 45 is exposed to a predetermined temperature, such as 31° C. The output of the differential amplifier 43 then drops. The resistor 45 is effectively the temperature sensitive component 7 of FIG. 1, and is located at a position above the heating wire 5.

The output of the differential amplifier 43 is fed, by means of lead 47, to a node 48. The node 48 is connected through a resistor 49 to the gate of the field effect transistor 21.

The gate of the field effect transistor 21 is connected by means of a reverse biassed zenerdiode 50 to the pad 11, again to provide protection against transients.

To protect the field effect transistor 21 against thermal overload, means are provided to monitor the battery voltage. These means comprise two further differential amplifiers 51, 52, which respectively sense if the battery voltage is higher than is desirable, or is lower than is desirable.

One input of the differential amplifier 51 is connected to a node 52 formed between two resistors 53, 54 which are connected in series between the earth rail 27 and the rail 40. This input is also connected by means of a further resistor 55 to a node 56 which is connected to the output of the differential amplifier 51. The other input of the differential amplifier 51 is connected to the earth rail by means of a zenerdiode 57 and is also connected to the rail 40 by means of a resistor 58 and furthermore is connected to one input of the second differential amplifier 52.

This one input of the differential amplifier 52 is connected by means of a resistor 59 to a node 60 which is connected to the output of the differential amplifier 52. The second input of the differential amplifier 52 is connected to the earth rail 27 by means of a resistor 61 and is connected to the rail 40 by means of a resistor 62, and thus this second input of the differential amplifier 52 is connected to a node formed in a resistive bridge constituted by the series connection of the two resistors 61, 62 between the earth rail and the rail 40. The node 56 and the node 60 are each connected to the above-mentioned node 48.

Differential amplifier 52 effectively compares a reference voltage, at the node between the two resistors 61 and 62, which is thus directly representative of the battery voltage supplied, with a separate reference voltage effectively generated by the zenerdiode 57. If the detected voltage is above a pre-determined limit, for example if the battery voltage is more than 16 volts, then the output of the differential amplifier 52 goes low, thus applying a low signal to the node 48, and thus also applying a low signal to the gate of the field effect transistor 21. Thus the field effect transistor 21 is switched off under such circumstances.

On the other hand, the differential amplifier 51 compares a signal representative of the voltage supplied by the battery, as present at the node point 52 between the resistors 53 and 54 with the voltage effectively dictated by the zenerdiode 57, and if the battery voltage is lower than a pre-determined level the output of the differential amplifier 51 goes low, thus applying a low signal to the node 48, again applying a low signal to the gate of the field effect transistor 21, again switching the field effect transistor 21 off.

It is to be noted that the diode 38 is connected to the lead 40. Thus, in the normal state of the apparatus as described, any potential present on the lead 40 is supplied to the diode 38, and because of the biassing of the diode 38 that potential is present at the node 37 between the two diodes 38, 39.

The differential amplifier 29, and the associated components operate as an oscillator when the device is activated, providing an output signal at approximately 200 Hz on the lead 34. This signal is passed capacatively by the capacitor 36 to the node 37. This signal is thus effectively added to the potential already present at the node 37, and the combined voltage is passed by the diode 39 to a node 61. A capacitor 62 extends from this node to the line 24, and a resistor 63 connects the node 61 to the gate of the field effect transistor 21. The voltage applied to the gate, through the voltage doubler as represented by the diodes 38 and 39, is sufficient to turn the field effect transistor on, provided that there is not a low signal applied to the node 48. If a low signal is applied to the node 48, this will pull down any high signal applied to the gate of the field effect transistor.

As has been described above, the differential amplifier 43 will apply a high signal to the node 48 whenever the resistor 45 is subjected to a predetermined temperature such as 30° C. Also the differential amplifiers 51 and 52 will apply high signals to the node 48 when the battery voltage is within the appropriate pre-determined limits. Thus, under these circumstances, power will be supplied to the heating wire 5.

It is to be noted that if the battery voltage falls below a pre-determined limit, then even the voltage doubler circuit constituted by the diodes 38 and 39 cannot provide a sufficient gate-source voltage to turn the field effect transistor 21 completely on. In such a case the field effect transistor 21 would act as a resistance and an excessive power loss could eventually destroy the field effect transistor 21.

Whilst the invention has been described with reference to one embodiment it is to be appreciated that modified embodiments may be devised, and such modified embodiments may have different features.

For example, whilst the invention has been described with reference to an arrangement in which the printed circuit board carries a number of discrete components, it is envisaged that the circuitry may be constituted by integrated components. In such embodiments, therefore, it would be possible to arrange the integrated circuit so that, whenever the arrangement is initially activated, the seat is initially heated to a temperature higher than the normal temperature set by the thermostat effectively represented, in the described embodiment, by the resistive bridge 45, 46. This provides rapid heating of the seat, and also provides a sensation of heat which is often desirable when a driver or passenger have just entered a cold car. Once such a high temperature level has been reached, subsequently a lower level will be provided by the thermostat.

Also, to prevent this seat heater from being supplied with power under a short circuit condition, a fault sensing circuit may be provided, to disable the circuit, if the voltage drop across the heater wire 5 is lower than a pre-set value.

Additionally a low voltage control may be provided. Such an arrangement would sense the condition of the battery by sensing the output voltage of the battery. If the output voltage falls below a pre-determined level, the arrangement will be disabled to ensure that no further power is effectively "wasted" by being supplied to a seat heater.

To achieve an improved cooling for the components mounted on the printed circuit board, especially the power transistor, the reverse face of the printed circuit board may be provided with a copper coating which substantially covers the entire surface of the board to provide a "heat sink". The board is thin and flexible and all signal tracks and connections are provided only on the front face of the board.

I claim:
1. A heating arrangement for heating a seat, comprising:
electrical heating means embedded in the seat;
a flexible printed circuit board embedded in the seat; and
components mounted on said flexible printed circuit board constituting temperature responsive means and control means, said temperature responsive means for sensing a temperature of the seat and providing a control signal whenever the sensed temperature is below a predetermined limit, said control means comprising a power transistor having electrodes for connection between a supply of electrical current and said electrical heating means, said power transistor further having a control electrode coupled to said temperature responsive means for receiving the control signal, said power transistor controlling the supply of electrical current to said electrical heating means in response to the control signal, and said control means further including a voltage doubler connected to the control electrode of said power transistor for doubling a voltage present on the current supply.

2. An arrangement according to claim 1 wherein said transistor comprises a field effect transistor.

3. An arrangement according to claim 1 wherein said temperature responsive means comprises a temperature sensitive component and the control means comprise a differential amplifier, means to provide a substantially constant pre-determined potential to a first terminal thereof, and means to provide a potential to a second terminal thereof, which include the temperature sensitive component so that a potential supplied to the second terminal of the differential amplifier depends upon the temperature sensed by the temperature sensitive component.

4. An arrangement according to claim 3 wherein said temperature sensitive component comprises a thermistor, the first terminal of the differential amplifier is connected to a node between the resistors connected in series between an earth rail, and a rail carrying a substantially pre-determined potential, and the second terminal of the differential amplifier is connected to a node between a series connection of a resistor and said thermistor connected in series between earth and said rail carrying said pre-determined potential.

5. An arrangement according to claim 1, wherein said control means includes an oscillator to provide an oscillating output signal having an amplitude, said voltage doubler comprising a series connection of first and second diodes, the first diode being connected to a source of predetermined potential, and the output signal of the oscillator being connected to a node between the first and second diodes, so that output of the second diode comprises the sum of the predetermined potential and the amplitude of the oscillating output signal, the output at the second diode being connected to the control electrode of the power transistor and said control means being adapted to provide a "low" signal to said control electrode to disable the power transistor.

6. An arrangement according to claim 5 wherein the control means further comprises means for sensing the potential provided to the heating arrangement from a battery and to provide said "low" signal to disable the transistor when the potential exceeds a pre-determined limit and when the potential is lower than another pre-determined limit.

7. An arrangement according to claim 6 wherein the said sensing means comprises two further differential amplifiers having input terminals, a first terminal of each differential amplifier being connected to a substantially constant source of potential, a second terminal of each differential amplifier being connected to a respective node in a respective resistive bridge extending between earth and a line carrying a signal proportional to the potential supplied by the battery, the arrangement being such that a respective one of the differential amplifiers will provide said "low" signal to the control electrode of the power transistor in response to battery potential exceeding a pre-determined limit or falling below another pre-determined limit.

8. An arrangement according to claim 1 wherein the flexible printed circuit board carries one or more discrete components, each component having at least two terminals connected to signal tracks present on the board, the signal tracks connected to the terminals of at least one component each splitting to form two signal track portions at a point spaced from the respective terminal, the two signal track portions approaching and contacting the terminal in directions which are perpendicular to each other.

9. An arrangement according to claim 1 wherein the printed circuit board comprises components mounted thereon and a plurality of signal tracks, the signal tracks having a pre-determined width, the printed circuit board carrying a plurality of bonding areas in contact with respective signal tracks, each bonding area having a width and a height equal to at least ten times the width of a signal track.

10. An arrangement according to claim 1 wherein the temperature responsive means comprise a first thermostatic control means responsive to the temperature in the seat to control the seat temperature to be at a pre-determined level, the arrangement including second thermostatic control means and means to activate the second thermostatic control means when the heating arrangement is initially activated, the second thermostatic control means being adapted to control the temperature of the seat at a higher temperature than the first thermostatic control means, the arrangement being such that when the heating arrangement is initially activated the seat is initially heated to a relatively high temperature as dictated by the second thermostatic control means, and subsequently cools to and is maintained at the lower temperature dictated by the first thermostatic control means.

11. An arrangement according to claim 1, said heating arrangement incorporating a heater wire to which electrical power is supplied, means being provided to monitor the voltage drop across the heater wire, and to disable the heating means if the voltage across the heater wire drops below a pre-set value.

12. An arrangement according to claim 1, said arrangement incorporating means to sense the potential supplied to the heater arrangement, and means to disable the heater arrangement if the potential supplied thereto falls below a pre-determined limit.

13. A heating arrangement for heating a seat, comprising:
 electrical heating means embedded in the seat;
 a flexible printed circuit board embedded in the seat; and
 components mounted on said flexible printed circuit board constituting temperature responsive means and control means, said temperature responsive means for sensing a temperature of the seat and providing a control signal whenever the sensed temperature is below a predetermined limit, said control means including an oscillator to provide an oscillating output signal having an amplitude and a power transistor having electrodes for connection between a supply of electrical current and said electrical heating means, said power transistor further having a control electrode coupled to said temperature responsive means for receiving the control signal, said power transistor controlling the supply of electrical current to said electrical heating means in response to the control signal, and said control means further including a voltage doubler connected to the control electrode of said power transistor for doubling a voltage present on the current supply, said voltage doubler comprising a series connection of first and second diodes, the first diode being connected to a source of predetermined potential, and the output signal of the oscillator being connected to a node between the first and second diodes, so that output of the second diode comprises the sum of the predetermined potential and the amplitude of the oscillating output signal, the output at the second diode being connected to the control electrode of the power transistor, and said control means being adapted to provide a "low" signal to said control electrode to disable the power transistor.

* * * * *